United States Patent [19]

Biard

[11] Patent Number: 4,661,726

[45] Date of Patent: Apr. 28, 1987

[54] UTILIZING A DEPLETION MODE FET OPERATING IN THE TRIODE REGION AND A DEPLETION MODE FET OPERATING IN THE SATURATION REGION

[75] Inventor: James R. Biard, Richardson, Tex.

[73] Assignee: Honeywell Inc., Minneapolis, Minn.

[21] Appl. No.: 793,379

[22] Filed: Oct. 31, 1985

[51] Int. Cl.[4] .................... H03K 17/14; H03K 19/094
[52] U.S. Cl. .................................. 307/450; 307/443; 307/448; 307/304; 307/310; 357/22 C; 357/23.12
[58] Field of Search .................... 307/200 B, 443, 448, 307/450, 571–575, 577, 584, 297, 303, 304, 310; 357/226, 22 E, 23.3, 23.12

[56] References Cited

U.S. PATENT DOCUMENTS

| | | | |
|---|---|---|---|
| 3,436,621 | 4/1969 | Crawford | 357/41 X |
| 3,508,084 | 4/1970 | Warner, Jr. | 357/41 X |
| 3,828,230 | 8/1974 | Nishizawa et al. | 357/22 C |
| 4,069,430 | 1/1978 | Masuda | 307/450 X |
| 4,405,870 | 9/1983 | Eden | 307/450 X |
| 4,433,257 | 2/1984 | Kinoshita | 307/443 |
| 4,450,369 | 5/1984 | Schuermeyer | 307/450 |
| 4,473,762 | 9/1984 | Iwahashi et al. | 307/310 X |
| 4,499,416 | 2/1985 | Koike | 307/297 X |
| 4,578,694 | 3/1986 | Ariizumi et al. | 307/450 X |

FOREIGN PATENT DOCUMENTS 2833068  2/1979  Fed. Rep. of Germany .... 357/22 E

Primary Examiner—Stanley D. Miller
Assistant Examiner—D. R. Hudspeth
Attorney, Agent, or Firm—John P. Sumner; Stephen W. Buckingham

[57] ABSTRACT

A temperature compensation system for semiconductor logic gates where the temperature compensation is accomplished by two depletion mode FET's in electrical series relationship is disclosed. One of the FET's is adapted to operate in its triode region of operation and the other in its saturation region of operation.

50 Claims, 4 Drawing Figures

UTILIZING A DEPLETION MODE FET OPERATING IN THE TRIODE REGION AND A DEPLETION MODE FET OPERATING IN THE SATURATION REGION

The present invention relates to semiconductor logic gates comprising depletion mode field effect transistors (FET's) and more particularly to temperature compensation therefor.

BACKGROUND OF THE INVENTION

Some types of semiconductor logic gates show a strong temperature dependence. This effect has proved to be particularly a problem in logic gates which use a gallium aresenide depletion mode FET's but also may arise in other instances. The result of this temperature dependence is to limit the temperature range over which such logic gates may be used. This limited temperature range is much less than the full military temperature range of $-55°$ C. to $+125°$ C. for some logic families. In order to obtain logic gates of such families which can operate over this entire range, a temperature compensation scheme is required. The present invention provides such a temperature compensation system.

SUMMARY OF THE INVENTION

The present invention utilizes at least one depletion mode FET designed to be operated in the triode region in electrical series relationship with a depletion mode FET designed to be operated in the saturation current region to provide temperature compensation in a logic gate.

DETAILED DESCRIPTION OF THE PREFERRED EMBODIMENT

The temperature compensation scheme of the invention has been tested with logic gates which utilize gallium arsenide metal semiconductor field effect transistors (MESFET's). The invention will therefore be described in terms of such logic gates. Those skilled in the art will readily perceive that the invention may be used with any logic gate utilizing depletion mode FET's. Such FET's may be metal oxide semiconductor field effect transistors (MOSFET's), metal insulator semiconductor field effect transistors (MISFET's), or junction field effect transistors (JFET's), as well as MESFET's. Furthermore, any semiconductor materials, such as silicon or indium arsenide, as well as gallium arsenide, may be used.

Long channel gallium arsenide MESFET's can be described by two basic equations. For the low current region, where the MESFET acts as a triode, the following equation applies:

$$I_d = I_{dso}[W/L]\{[2(V_g-V_p)/(-V_p)][(V_d/-V_p)-(V_d/-V_p)^2]\} \tag{1}$$

For the higher current saturation region, the following equation applies:

$$I_d = I_{dso}[W/L][(V_g-V_p)/(-V_p)]^2 \tag{2}$$

In these equations W is the gate width, L is the gate length, $V_g$ is the gate to source voltage, $V_p$ is the pinch-off voltage, $V_d$ is the drain to source voltage, $I_d$ is the drain current, and $I_{dso}$ is a process dependent parameter with units of current. The value of $I_{dso}$ is given by the following equation:

$$I_{dso} = q\mu(Nt)_0(-V_p/2) \tag{3}$$

where q is the charge of the electron, $\mu$ is the effective electron mobility in the channel region, and $(Nt)_0$ is the undepleted charge density in the channel at $V_g=0$.

In the discussion to follow, the parameters and dimensions given are for example only and assume theoretical MESFET's, i.e. no source lead resistance or other deviations from theory, and are based on processes currently in use by the Honeywell Opto-electronics Division. Those skilled in the art will perceive that other dimensions could be used and might be required by variations from the "perfect" devices assumed herein or by differences in products produced by different processes.

Figures 1, 2, 3:
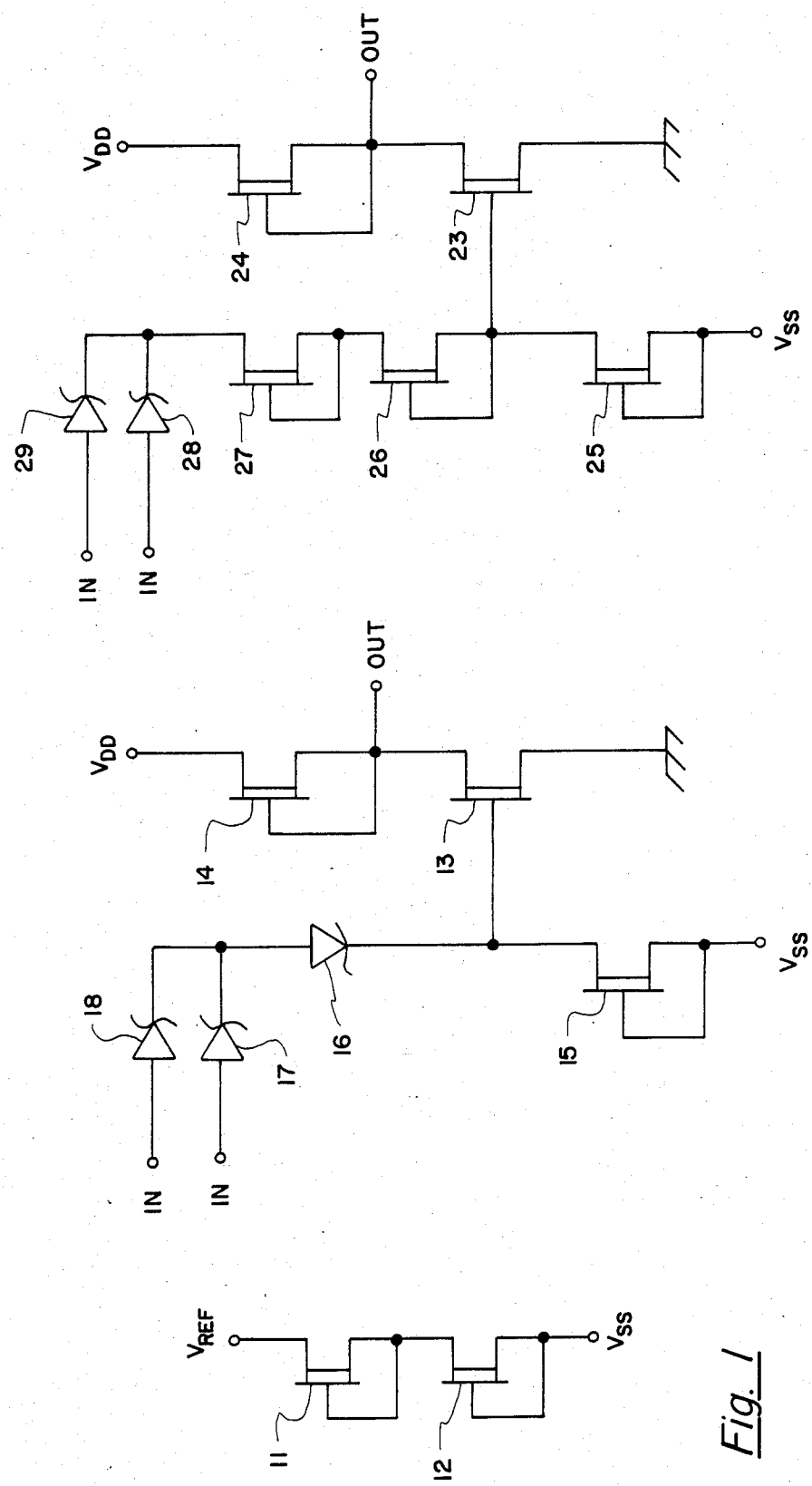
FIG. 1 is a schematic diagram of the temperature compensation element of the present invention.
FIG. 2 is a schematic diagram of a Schottky diode FET logic gate of the prior art.
FIG. 3 is a schematic diagram of a Schottky diode FET logio gate with temperature compensation.

FIG. 1 shows the basic temperature compensating element of the invention. This element compromises two depletion mode gallium arsenide MESFET's 11 and 12. Transistor 11 operates in the saturation region as described by equation (2) while transistor 12 operates in the triode region described by equation (1). Both transistors 11 and 12 have an electrical conductor connecting the source region with the gate region. Therefore, $V_g$ equals zero for both transistors. Transistors 11 and 12 are assumed to be in close physical proximity on an integrated circuit die, both to one another and to the logic gate for which they will be a compensating element. This insures that the value of $I_{dso}$ will be similar for transistors 11 and 12 and for the logic gate. It further insures that they will be at essentially the same temperature. Transistor 12 is assured of operation in the triode region by appropriate selection of the length and width of its gate relative to the length and width of the gate of transistor 11.

The voltage drop across transistor 12 is $V_{d12}$. The value of $V_{d12}$ may be obtained by setting $I_d$ in equation (1) equal to $I_d$ in equation (2) and setting $V_g=0$ for both equations. This gives:

$$I_{dso}[W_{12}L_{12}][2(V_{d12}/-V_p)-(V_{d12}/-V_p)^2] = I_{dso}[W_{11}/L_{11}] \tag{4}$$

which may be simplified to:

$$(V_{d12}/-V_p)^2 - 2(V_{d12}/-V_p) + W_{11}L_{12}/L_{11}W_{12} = 0 \tag{5}$$

Using the quadratic formula we may solve equation (5) for $V_{d12}$ to obtain the results:

$$V_{d12} = [1 - \sqrt{1 - W_{11}L_{12}/L_{11}W_{12}}\,](-V_p) \tag{6}$$

All of the terms in the brackets are constant. Thus, it follows that $V_{d12}$ has the same temperature dependence as $(-V_p)$.

Typical ion implanted, depletion mode, gallium arsenide MESFET's may have the following parameters:

$$V_p = -1.0 \text{ V}$$

$$\Delta V_p \Delta T = -2.0 \text{ mV/}^\circ\text{C}.$$

$$I_{dso} = 120 \text{ } \mu\text{A} \tag{7}$$

Using these values and setting $L_{11}=10$ $\mu$m and $W_{11}=2.5$ $\mu$m the drain current for transistor 11 is equal to 30 $\mu$A.

Thus, $V_{d12}$ has a positive fractional temperature coefficient of 0.002/°C.

FIG. 2 shows a typical Schottky diode FET logic (SDFL) gate of the type normally used with gallium arsenide depletion mode MESFET's. Typical values of the circuit parameters are $V_{DD}=2.0$ V and $V_{SS}=-2.5$ V. The gain MESFET 13 is normally made wider than the load MESFET 14 in order to allow the pull down current to be twice the value of the pull up current. In this way, the current drive for pull down and pull up of the wiring capacitance connected to the output node provide pullup and pull down slew rates that are equal to one another.

The cross over point between high and low logic states at the output node occurs when $I_{d13}=I_{d14}$. The output voltage at the crossover point is equal to $\frac{1}{2}$ of $V_{DD}$ or 1.0 V. Using equation (2), it can be shown that the crossover voltage at the gate of transistor 13 is given by:

$$V_{g13co} = [-1 + \sqrt{W_{14}L_{13}/L_{14}W_{13}}\,](-V_p) \tag{8}$$

In order to provide minimum sensitivity to process induced changes in gate length, the gate length of transistor 13 and 14 are typically made equal. If this is the case and $W_{13}=10$ $\mu$m and $W_{14}=5$ $\mu$m the input crossover voltage at 25° C. is $-0.293$ V. From equation (8), $V_{g13co}$ has the same fractional temperature coefficient as $(-V_p)$. Thus, over a range of temperatures, the value of $V_{g13co}$ is given by:

$$V_{g13co} = -0.293 \text{ } V - (0.586 mV/^\circ\text{C.})\Delta T \tag{9}$$

where $\Delta T$ is the difference between 25° C. and the current temperature. If Schottky diodes 16, 17, and 18 of FIG. 2 are designed to have dimensions of 1 $\mu$m by 3 $\mu$m there will be a voltage drop of 0.625 V at 25° C. and a temperature dependence of $-1.12$ mV/°C. The input voltage at crossover is equal to the voltage at the gate of transistor 13 plus the voltage drop across two of the Schottky diodes. Thus, this input crossover voltage may be seen to given by:

$$V_{inco} = 0.957 \text{ } V - (2.826 \text{ } mV/^\circ\text{C.})\Delta T \tag{10}$$

Equation (10) shows that the input crossover voltage has a large drift over temperature. At a temperature of 125° C. the input crossover voltage would be 0.674 V while at $-55°$ C. it would be 1.183 V. Therefore, the input crossover voltage nearly doubles over the military temperature range.

For a fan out of 3 at 25° C. the SDFL gate of FIG. 2 has an AC noise margin of 135 mV for the system high voltage level. When the fan out is 1 the low level AC noise margin is 170 mV. Thus, gate arrays implemented with such standard gates can be expected to work only over a temperature range of $-35°$ C. to 73° C.

FIG. 3 shows the logic gate of FIG. 2 with the temperature compensation element of FIG. 1. In the logic gate of FIG. 3, transistor 23 corresponds to transistor 13 of FIG. 2, but has had its width reduced to 9 $\mu$m to keep the input crossover voltage at 0.957 V. Transistors 23 and 24 each have a gate length of a 2 $\mu$m and transistor 24 has a gate width of 5 $\mu$m. For the circuit of FIG. 3 the crossover voltage at the gate of transistor 23 at 25° C. is $-0.254$ V and the temperature dependence is $-0.508$ mV/°C.

MESFET's 26 and 27 in conjunction with MESFET 25 provide the temperature compensation for the circuit of FIG. 3. The gate length of transistors 26 and 27 is selected to insure that these transistors operate in the triode region and to insure that the saturation current of each of these transistors is twice as large as that of transistor 25. The latter condition provides equal positive and negative current to drive the input capacitance of transistor 23. Using the parameters which have been previously defined for the various devices, the conditions above are met if the gate width of transistors 25, 26, and 27 are all 2.5 $\mu$m and the length of the gate of transistor 25 is 10 $\mu$m while the length of the gates of transistors 26 and 27 are 5 $\mu$m. With these selections of device sizes the saturation current of transistor 25 is 60 $\mu$A and the source to drain voltage of transistor 25 at 25° C. is equal to 0.293 V with a temperature dependence of 0.586 mV/°C. The input voltage for the gate of FIG. 3 is equal to the voltage applied to the gate of transistor 23 plus the source to drain voltages of transistors 26 and 27 plus the voltage change across either diode 28 or 29. Using the figures given earlier, the crossover input voltage is equal to 0.957 V at 25° C. with a temperature dependence of $-0.456$ mV/°C. Comparing this temperature dependence with the crossover input temperature dependence of 2.826 mV/°C. for the non-temperature compensated gate of FIG. 2, the temperature dependence may be seen to be reduced by a factor of 6.2. Thus, the gate may operate successfully over the entire military temperature range with a fanout of up to 3 without the AC noise margin becoming a problem.

Figure 4:
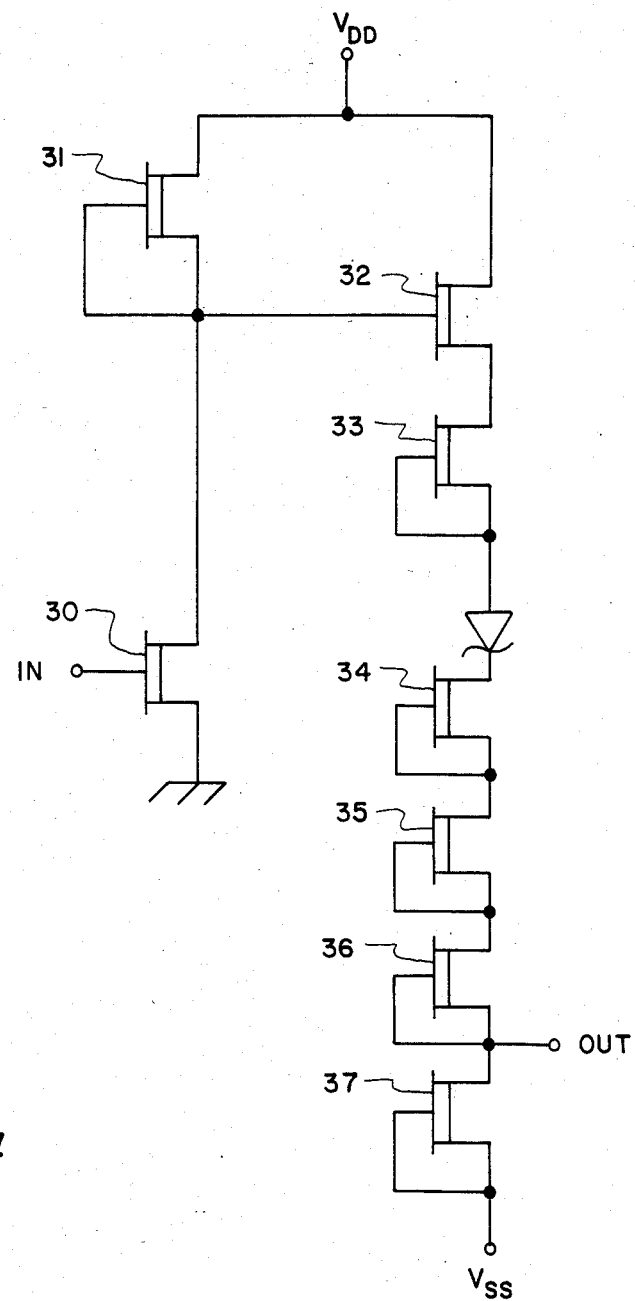
FIG. 4 is a schematic diagram of a buffered FET logic gate with temperature compensation.

FIG. 4 shows a buffered FET logic (BFL) gate utilizing the temperature compensation scheme of the invention. In a typical BFL circuit transistor 31 would be a minimum size MESFET, such as a gate width of 2.5 $\mu$m and a gate length of 1 $\mu$m. Transistor 30 would typically have the same gate length as transistor 31 but a width twice as great. This is to provide equal pull up and pull down rates for the capacitance at the input of MESFET 32. Given these values, the crossover voltage at the input of transistor 30 is $-0.93$ V at 25° C. with a temperature dependence of 0.586 mV/°C. Transistors 32, 33, and 36 are designed to have twice the width of transistor 37 in order to provide equal positive and negative slew rates for charging the wiring capacitance on the output node. Transistor 37 is sized to drive the expected wire capacitance. Typical values could be a length of 1 $\mu$m for each of transistors 32, 33, 36 and 37 and a width of 10 $\mu$m for transistors 32, 33 and 36 and a width of 5 $\mu$m for transistor 37. In this circuit, temperature compensation is provided by MESFET's 33, 34, 35, and 36 working in conjunction with MESFET 37. For these dimensions, at crossover, the gate to source voltage of transistor 32 is reverse biased and is equal to $-0.93$ V with a temperature dependence of $-0.586$ mV/°C. The voltage drop across transistors 33 and 36 is equal to 0.293 V with a temperature dependence of 0.586 mV/°C. Thus, transistors 33 and 36 effectively completely cancel the gate to source bias and temperature drift of transistors 31 and 32.

If transistors 34 and 35 are designed to have a gate length of 1 μm and a width of 14 μm the combined voltage drop across these two transistors at 25° C. will be 0.375 V with a 0.75 mV/°C. temperature dependence. Thus, the output crossover voltage for the circuit of FIG. 4 is −0.293 V at 25° C. with a temperature dependence of 0.37 mV/°C.

The AC noise margin of the BFL gate of FIG. 4 is independent of fan out. The high level and low level AC noise margins are each 210 mV at 25° C. Thus, the AC noise margin remains at 173 mV at 125° C. and 180 mV at −55° C. Such a gate therefore provides outstanding performance over the entire military temperature range.

Similar results could be obtained for the circuit of FIG. 4 if transistors 33, 34, 35, and 36 were each designed to have a gate length of 11.8 μm. Such a gate would exhibit a greater pull up rate than its pull down rate, but, as long as both rates are within specifications, this will not create a problem. The important parameter is the total voltage drop across the temperature compensating elements, which are transistors 33, 34, 35, and 36.

Experimental data has shown that the temperature compensated SDFL of FIG. 3 and the temperature compensated BFL gate of FIG. 4 exhibit a switching speed independent of temperature and equal to the switching speed of comparable gates without the temperature compensation. Furthermore, the power dissipation of the temperature compensated gates has been observed to be equal to that of the standard comparable gates. Thus, no speed or power dissipation penalty is incurred from the use of the temperature compensation system.

The present discussion has shown the use of the basic temperature compensating element of FIG. 1 with SDFL and BFL circuits. Those skilled in the art will perceive that this system for temperature compensation is not limited to such circuits. Other types of logic families could be used with similar temperature compensation. Among those which could effectively be used with the present temperature compensation system are source coupled FET logic (SCFL) and low pinch-off FET logic (LPFL)

The embodiments of the invention in which an exclusive property or right is claimed are defined as follows:

1. A temperature compensated logic gate comprising depletion mode FET's, said logic gate being constructed at least in part in a body of semiconductor material, said logic gate comprising temperature compensation means, said temperature compensation means comprising:
    a first depletion mode FET means having first and second terminal regions in said semiconductor body, a gate terminal region comprising a metallic electrical conductor means on a surface of said semiconductor body, and a channel region defined by electrical voltage conditions on said first FET means gate terminal region, said first FET means first terminal region being connected for operation at a higher voltage than said first FET means second terminal region, said first FET means gate terminal region being electrically connected to said first FET second terminal region, said first FET means being adapted to operate at current levels within its triode region of operation by appropriate choice of width to length ratio of said first FET means channel region; and
    a second FET means having first and second terminal regions in said semiconductor body, a gate terminal region, and a channel region defined by electrical voltage conditions as said second FET means gate terminal region, said second FET means first terminal region being connected for operation at a higher voltage than said second FET means second terminal region, said second FET means gate terminal region being electrically connected to said second FET means, said second FET means first terminal region being electrically connected in series with said first FET means second terminal region, said second FET means being adapted to operate at current levels in its saturation mode of operation by appropriate choice of width to length ratio of said second FET means channel region.

2. The apparatus of claim 1 wherein said semiconductor body comprises gallium arsenide.

3. The apparatus of claim 1 wherein said logic gate is of a type known as Schottky diode FET logic.

4. The apparatus of claim 3 wherein said semiconductor body comprises gallium arsenide.

5. The apparatus of claim 1 wherein said logic gate is of the type known as buffered FET logic.

6. The logic gate of claim 5 wherein said semiconductor body comprises gallium arsenide.

7. The logic gate of claim 1 wherein said first and second depletion mode FET means are MESFET's.

8. The apparatus of claim 7 wherein said semiconductor body comprises gallium arsenide.

9. The apparatus of claim 7 wherein said logic gate is of the type known as Schottky diode FET logic.

10. The apparatus of claim 9 wherein said semiconductor body comprises gallium arsenide.

11. The apparatus of claim 7 wherein said logic gate is of the type known a buffered FET logic.

12. The logic gate of claim 11 wherein said semiconductor body comprises gallium arsenide.

13. The logic gate of claim 1 wherein said first and second depletion mode FET's are MISFET's.

14. The apparatus of claim 13 wherein said semiconductor body comprises gallium arsenide.

15. The apparatus of claim 13 wherein said logic gate is of the type known as Schottky diode FET logic.

16. The apparatus of claim 15 wherein said semiconductor body comprises gallium arsenide.

17. The apparatus of claim 13 wherein said logic gate is of the type known as buffered FET logic.

18. The logic gate of claim 17 wherein said semiconductor body comprises gallium arsenide.

19. The logic gate of claim 1 wherein said first and second depletion mode FET means are JFET's.

20. The apparatus of claim 19 wherein said semiconductor body comprises gallium arsenide.

21. The apparatus of claim 19 wherein said logic gate is of the type known as Schottky diode FET logic.

22. The apparatus of claim 21 wherein said semiconductor body comprises gallium arsenide.

23. The apparatus of claim 22 wherein said logic gate is of the type known as buffered FET logic.

24. The logic gate of claim 23 wherein said semiconductor body comprises gallium arsenide.

25. The logic gate of claim 1 wherein said first and second depletion mode FET means are MOSFET's.

26. A logic gate formed at least in part in a semiconductor body, said logic gate comprising depletion mode FET's and including temperature compensation means, said temperature compensation means comprising first and second depletion mode FET means electrically connected in series, each of said FET means having a channel region, said first FET means being adapted to operate at current levels within its triode region of operation by appropriate choice of width to length ratio of said first FET means channel region and said second FET means being adapted to operate at current levels within its saturation region of operation by appropriate choice of width to length ratio of said first FET means channel region.

27. The logic gate of claim 26 wherein said semiconductor body comprises gallium arsenide.

28. The logic gate of claim 26 wherein said logic gate is of the type known as Schottky diode FET logic.

29. The logic gate of claim 28 wherein said semiconductor body comprises gallium arsenide.

30. The logic gate of claim 26 wherein said logic gate is of the type known as buffered FET logic.

31. The logic gate of claim 30 wherein said semiconductor body comprises gallium arsenide.

32. The logic gate of claim 26 wherein said first and second depletion mode FET means are MESFET's.

33. The apparatus of claim 32 wherein said semiconductor body comprises gallium arsenide.

34. The apparatus of claim 32 wherein said logic gate is of the type known as Schottky diode FET logic.

35. The apparatus of claim 34 herein said semiconductor body comprises gallium arsenide.

36. The apparatus of claim 32 wherein said logic gate is of the type known as buffered FET logic.

37. The logic gate of claim 36 wherein said semiconductor body comprises gallium arsenide.

38. The logic gate of claim 26 wherein said first and second depletion mode FET's are MISFET's.

39. The apparatus of claim 38 wherein said semiconductor body comprises gallium arsenide.

40. The apparatus of claim 38 wherein said logic gate is of the type known as Schottky diode FET logic.

41. The apparatus of claim 40 wherein said semiconductor body comprises gallium arsenide.

42. The apparatus of claim 38 wherein said logic gate is of the type known as buffered FET logic.

43. The logic gate of claim 42 wherein said semiconductor body comprises gallium arsenide.

44. The logic gate of claim 26 wherein said first and second depletion mode FET means are JFET's.

45. The apparatus of claim 44 wherein said semiconductor body comprises gallium arsenide.

46. The apparatus of claim 44 wherein said logic gate is of the type known as Schottky diode FET logic.

47. The apparatus of claim 46 wherein said semiconductor body comprises gallium arsenide.

48. The apparatus of claim 44 wherein said logic gate is of the type known as buffered FET logic.

49. The logic gate of claim 48 wherein said semiconductor body comprises gallium arsenide.

50. The logic gate of claim 26 wherein said first and second depletion mode FET means are MOSFET's.

* * * * *